(12) United States Patent
Shoulders

(10) Patent No.: US 7,002,335 B2
(45) Date of Patent: Feb. 21, 2006

(54) METHOD FOR MEASURING A THREE-PORT DEVICE USING A TWO-PORT VECTOR NETWORK ANALYZER

(75) Inventor: Robert E. Shoulders, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/854,104

(22) Filed: May 24, 2004

(65) Prior Publication Data

US 2005/0258815 A1   Nov. 24, 2005

(51) Int. Cl.
*G01R 23/14* (2006.01)
*G01R 27/04* (2006.01)

(52) U.S. Cl. .................... 324/76.23; 324/638
(58) Field of Classification Search ............ 324/76.23, 324/76.19, 76.12, 76.11, 601, 600, 130, 202, 324/74, 158.1, 629, 637, 638; 702/57, 65, 702/117
See application file for complete search history.

(56) References Cited

U.S. PATENT DOCUMENTS

| | | | | |
|---|---|---|---|---|
| 4,680,538 | A * | 7/1987 | Dalman et al. .............. 324/638 |
| 5,524,281 | A * | 6/1996 | Bradley et al. .......... 455/67.15 |
| 5,578,932 | A * | 11/1996 | Adamian .................... 324/601 |
| 6,064,694 | A * | 5/2000 | Clark et al. ................. 375/224 |
| 6,211,663 | B1 * | 4/2001 | Moulthrop et al. ....... 324/76.23 |
| 6,396,285 | B1 * | 5/2002 | Blackham .................. 324/601 |
| 6,448,786 | B1 | 9/2002 | Dunsmore et al. |
| 6,529,844 | B1 * | 3/2003 | Kapetanic et al. ............ 702/85 |
| 6,832,170 | B1 * | 12/2004 | Martens ........................ 702/65 |
| 6,920,407 | B1 * | 7/2005 | Adamian et al. ........... 702/104 |
| 6,928,373 | B1 * | 8/2005 | Martens et al. .............. 702/65 |
| 6,937,032 | B1 * | 8/2005 | Adamian .................... 324/683 |
| 6,943,563 | B1 * | 9/2005 | Martens ...................... 324/638 |
| 2002/0196033 | A1 * | 12/2002 | Martens ..................... 324/612 |
| 2004/0153265 | A1 * | 8/2004 | Martens ....................... 702/65 |
| 2005/0088166 | A1 | 4/2005 | Shank et al. |
| 2005/0107972 | A1 * | 5/2005 | Wong et al. ................ 702/107 |

OTHER PUBLICATIONS

User's Guide HP 8753ET HP 8753ES Network Analyzers, Hewlett-Packard Company, HP Part No. 875390472, 1999. Available from Agilent Technologies, Inc.

Albert Gleissner, Using the Frequency Conversion Mode of Vector Network Analyzer ZVR, Application Note 1EZ47-0E, Jan. 1999, Products ZVRL, ZVRE, ZVR, ZVC, ZVCE with Option ZVR-B4. Rohde & Schwarz.

Application Note 1408-1, PNA Microwave Network Analyzers, Mixer Transmission Measurements Using The Frequency Converter Application, Agilent Technologies, Inc. (Jan. 27, 2004).

Application Note, Multiple Source Mode, Scorpion Standard Feature, Anritsu, Microwave Measurements Division (Apr. 2000).

MS4622A/B/C/D MS4623A/B/C/D MS4624A/B/C/D Vector Network Measurement Systems 10 MHz to 9 GHz, Anritsu, Microwave Measurements Division (May 2003).

* cited by examiner

Primary Examiner—Anjan Deb
Assistant Examiner—Hoai-An D. Nguyen

(57) ABSTRACT

A method for vector characterization of a frequency translation device ("FTD") includes coupling a first signal from a first signal source through a reference directional coupler and through a test directional coupler of an electronic test set to a first port of the FTD. A second signal from the reference directional coupler is coupled to a first receiver of a vector network analyzer ("VNA"). A third signal is coupled from the test directional coupler to a second receiver of the VNA; and a vector parameter of the first port of the FTD is measured with the VNA.

20 Claims, 4 Drawing Sheets

METHOD FOR MEASURING A THREE-PORT DEVICE USING A TWO-PORT VECTOR NETWORK ANALYZER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Frequency translation devices ("FTDs"), such as mixers and frequency converters, are designed to be simultaneously stimulated by two different electrical and/or optical signals at two of three ports. For example, a mixer having a signal input, a local oscillator ("LO") input, and an output is designed to be simultaneously stimulated by an input stimulus signal and by an LO stimulus signal, which produces a mixing product, such as an intermediate frequency ("IF") signal, at the output. The LO stimulus signal is also called a "drive signal" or "LO drive" in some instances. Accurate characterization of such devices is important to predict their performance during use. Characterization at high frequencies (e.g. radio and microwave frequencies, and above) typically involves removing the effects of systemic errors, such as impedance mismatches between the FTD, which is also generally known as a device under test ("DUT"), and the measurement system, be removed.

One approach makes scalar network measurements of power into two ports, and the power out of the third port. However, scalar network measurements cannot accurately measure and remove mismatch errors between the test system and the DUT. Furthermore, scalar measurement systems use filters to separate the stimulus and the output signals in systems that use broad-band detectors to measure power incident upon and emanating from the DUT. These filters selectively allow only signals of a particular frequency range to pass. Such filters complicate or limit the capabilities of the test system when the DUT is characterized at many frequencies, since the filters are changed or adjusted as the measurement frequency changes.

Another technique is to use a conventional vector network analyzer. For three-port devices that do not require multiple stimulus sources, a three-port network analyzer with a three-port s-parameter calibration provides a suitable solution. However, for three-port devices that require simultaneous stimulation (multiple input signals) by two independent signal sources, conventional vector networks analyzers do not provide or account for the effects of the second source. A two-port measurement is typically done, using scalar measurements to characterize the second stimulus port, which is the LO port on a mixer, for example. This approach results in significant uncertainty due to the impedance mismatch between the LO port and the measurement system. Additionally, this approach does not provide means to measure transmission terms between the LO port and the other ports of the device, which may be important to completely and accurately characterize the DUT.

BRIEF SUMMARY OF THE INVENTION

A method for vector characterization of an FTD includes coupling a first signal from a first signal source through a reference directional coupler and through a test directional coupler of an electronic test set to a first port of the FTD. A second signal from the reference directional coupler is coupled to a first receiver of a vector network analyzer ("VNA"). A third signal is coupled from the test directional coupler to a second receiver of the VNA; and a vector parameter of the first port of the FTD is measured with the VNA.

DETAILED DESCRIPTION OF THE EMBODIMENTS

I. Exemplary Test Systems

Figure 1:
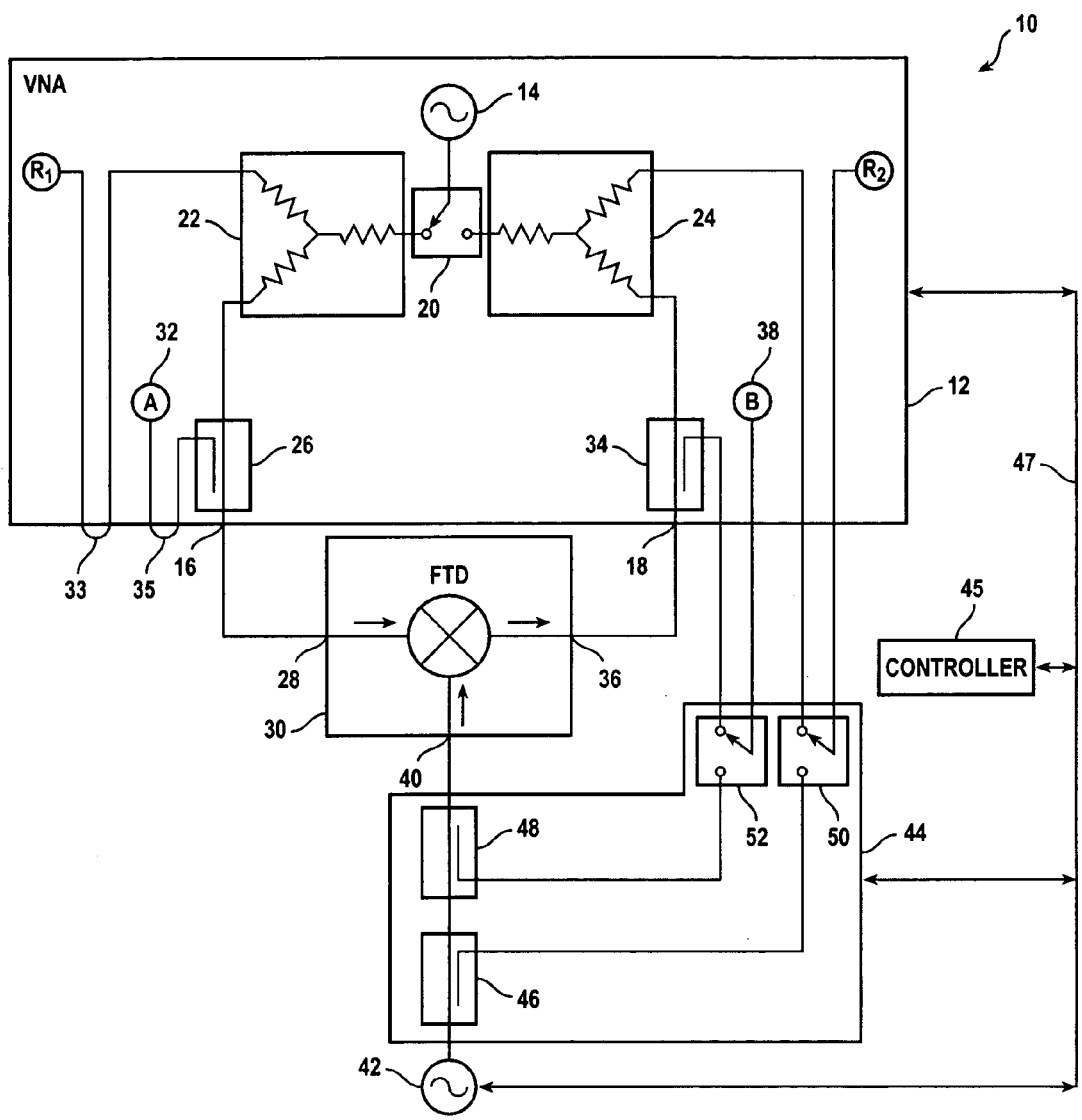
FIG. 1 is a diagram of an exemplary stimulus/response test system 10 for characterizing a frequency translation device constructed according to a first embodiment of the present invention.

FIG. 1 is a diagram of an exemplary stimulus/response test system 10 for characterizing an FTD 30 constructed according to a first embodiment of the present invention. A VNA 12 has at least one internal signal source 14 that is selectively connected to test port A 16 or test port B 18 through an internal switch 20 and power splitters 22, 24. This internal signal source 14 is often referred to as a "stimulus source." A suitable VNA is a MODEL E8362B, which is a two-port VNA, available from AGILENT TECHNOLOGIES, INC., of Palo Alto, Calif. Other types of stimulus/response instruments having vector (i.e. magnitude and phase) measurement capability are alternatively used to provide the source, detectors, and splitters. Examples of instruments used in alternative embodiments include three-port VNAs and two-port VNAs with a second internal source, such as an LO drive source.

The power splitters 22, 24 provide a first portion of a first signal from the internal signal source 14 to reference receivers $R_1$, $R_2$, and a second portion of the first signal from the internal signal source 14 to test port A 16, which is connected to the input port 28 of the FTD. As used herein, the term "port" refers to a signal port that receives or provides a relatively high-frequency signal, as opposed to a bias or low-frequency feed-through.

The reference receivers $R_1$, $R_2$ essentially track the signals at ports A 16 and B 18. A first test port directional coupler 26 couples signals emanating from the input 28 of the FTD 30 and/or transmitted from another port of the FTD 30 to the input 28 to a superheterodyne receiver 32. Test port B 18 has a similar test port directional coupler 34 that couples power from the output 36 of the FTD 30 to a second superheterodyne receiver 38 through a switch 52 in an electronic test set 44 that is external to the VNA 12. The terms "input" and "output" are used merely for convenience to facilitate understanding of signal paths in particular examples of measurements. "Broad-band" means that the detectors have reasonably flat frequency response over the frequency range of interest, such as the operating frequency range of the VNA 12.

Reference receivers $R_1$ and $R_2$ typically are receivers similar to the superheterodyne receivers 32, 38 associated with test port A 16 and test port B 18. The receivers associated with port A are separately tunable from the receivers associated with port B, which allows measuring a signal from the output 36 of the FTD 30 that is at a different frequency than the stimulus signal applied to the input 28 of the FTD. The VNA 12 has capability loops 33, 35 that bring the signal paths to receivers $R_1$ and test port A receiver 32 out to the front panel of the VNA 12. The capability loops for R2 and test port B receiver 38 have been "broken" and connected to switches 50, 52 in the electronic test set 44.

The FTD 30 has a third port 40, which will be referred to as the local oscillator ("LO") port for convenience of discussion. A second signal source 42 provides a second signal to the FTD that is typically different (e.g. different frequency and/or power) from the signal generated by the internal source. In some embodiments, the LO frequency is the same or essentially the same as the input frequency, such as when the FTD is a frequency discriminator. The second signal is often an LO drive signal of sufficient power to turn-on a mixer diode within the FTD. LO drive levels are typically between about 7 dBm to 25 dBm, depending on the application; however, these values are merely exemplary.

The second signal source 42 is a signal generator, sweeping source, or synthesizer, for example, or could be incorporated into a VNA or other test instrument. The second signal source 42 and the VNA 12 are typically electronically controlled, such as by a controller (not shown) integrated with the VNA 12 or integrated with the second signal source 42, or by an external controller (e.g. computer) 45 over a bus 47 that is connected to the VNA 12, the electronic test set 44 and the second signal source 42.

In a particular embodiment, the signal from the second signal source 42 is stepped, as is the internal signal source 14. Both sources typically share a common reference signal (time base) to enhance repeatability and accuracy of the measurement of the FTD 30, in other words, the first and second sources are stepped in a synchronous fashion, maintaining a frequency relationship to measure a vector parameter of the FTD 30. Alternatively, both the external signal source 42 and the internal signal source 14 are swept in a synchronous fashion. In yet another embodiment, the frequency of one source is held constant, and the frequency of other source is stepped or swept.

The electronic test set 44 includes an LO reference directional coupler 46, an LO test port directional coupler 48, a reference signal selection switch 50, and a test signal selection switch 52. The LO reference directional coupler 46 provides a signal proportional to the signal incident upon the LO port 40 to reference receiver $R_2$ when the reference signal selection switch 50 is switched from the as-shown position. The LO test port directional coupler 48 provides a signal proportional to the signal transmitted from the LO port 40 to detector B 38 when the test signal selection switch 52 is switched from the as-shown position.

The reference signal selection switch 50 is settable to provide either the signal from the LO reference directional coupler 46 or the port B reference splitter 24 to the reference receiver $R_2$ of the VNA 12. The test signal selection switch 52 is settable to provide either the signal from the LO test port directional coupler 48 or the test port B directional coupler 34 to the test port B receiver 38 of the VNA 12.

Many FTDs have particular LO frequency ranges and LO drive levels that are not directly available from a three-port VNA. The LO frequency range is often a small subset of the frequency range of a VNA, and the desired LO drive level is much higher than the signal level obtainable from a stimulus signal source internal to the VNA. For example, a VNA might produce a stimulus signal of up to 10 dBm at a test port (e.g. test port A 16), but over a range of a few megahertz to tens of gigahertz. Test port couplers (e.g. test port A coupler 26) capable of having the desired coupling characteristics at such high frequencies typically have very fine conductive traces that can be damaged or even destroyed if subjected to excessive power levels. The desired drive level can often be obtained from a three-port VNA or a 2-port VNA with an integrated second signal (LO drive) source by adding an amplifier between the signal source and the LO port of the FTD.

The LO frequency range for a particular FTD might be a single frequency, or a relatively small frequency range, such as over a few octaves, compared to the full test range of the VNA. In some FTDs the LO frequency range is over a very wide frequency range. Adding reflectometer capability for vector calibration and measurement of a third port of an FTD in an external test set, rather than designing it into a VNA, allows the test set to be built with couplers and other components optimized for performance over the LO frequency and power ranges of a particular FTD. Also, using a reflectometer according to embodiments of the present invention enables full three-port calibration and measurement of an FTD using a standard two-port VNA.

The test system shown in FIG. 1 has the capability to make all of the vector measurements (i.e. full three-port vector characterization with vector-corrected calibration) at various signal power levels and frequencies, particularly the signal power and frequency incident upon the LO port of the FTD. This is highly desirable because the characteristics of an FTD typically change with incident LO power. The ability to calibrate the LO power using vector-correction techniques allows a more accurate LO power setting during measurement of the FTD, and hence more accurate characterization of the FTD.

The test system 10 is calibrated with standards, such as short, open, load, thru ("SOLT") calibration standards, which are connected to or between the various ports of the test system. Such calibrations and associated vector measurements are well known in the art; therefore, a detailed description is omitted. The directional couplers 46, 48 and switches 50, 52 in the electronic test set 44 are configurable to allow calibration of both the LO port 40 and test port B 18, and the associated switches, cables, and directional couplers. The switches 50, 52 are configurable to measure the vector parameters of the third port of the FTD, such as the return loss of the LO port and the isolation and reverse isolation between the LO port and each of the input port 28 and output port 36 of the FTD 30.

The electronic test set 44 used with the two-port VNA 12 enables testing of several parameters, including:
1. vector-corrected parameters (e.g. s-parameters) of the FTD between the input and output ports 28, 36 at the input and output frequencies (with vector-calibrated LO power level);
2. vector-corrected (input and LO port power) scalar conversion gain of the FTD;
3. vector-corrected isolation between the input 28 and LO 40 ports of the FTD at the input frequency;

4. vector-corrected isolation between the LO 40 and input 28 ports of the FTD at the LO frequency;
5. vector-corrected isolation between the output 36 and the LO 40 ports of the FTD at the output frequency;
6. vector-corrected isolation between the LO 40 and output 36 ports of the FTD at the LO frequency;
7. vector-corrected reflection coefficient of the LO port 40 at the LO frequency, including vector-corrected reflection coefficient of the LO port at the LO frequency and various LO drive levels;
8. vector-corrected incident power on the LO 40 port at the LO frequency;
9. vector-corrected incident power on the input port 28 at the input frequency (with vector-calibrated LO power level at an LO operating level);
10. vector-corrected received power at the output port 36 at the output frequency (with vector-calibrated LO power level at an LO operating level).

These measurements are enabled by the ability to perform vector calibrations of the test system and FTD between all pairs of ports at the input, output, and LO frequencies. The use of the electronic test set 44 with an external second source 42 provides the ability to drive the LO of a mixer with no changes required to the VNA 12. The directional couplers 46, 48 in the electronic test set 44 enable vector measurements of the power incident on the LO port 40 of the FTD 30 and the reflection coefficient of the LO port 40 at any drive power level supported by the test set and source, including an LO operating level having sufficient drive power to turn on a mixer diode, for example. Vector measurement of the LO port reflection coefficient, the test set s-parameter error coefficients and the monitoring of the signal from the second source 42 by the reference receiver $R_2$ allows vector measurement of the power incident on the LO port 40 corrected for the effect of mismatch between the LO port 40 and the electronic test set 44.

The test system 10 has the ability to make precision measurements of mixer parameters while driving the LO port 40 of the FTD 30 with a known power level that simulates device operation. For example, the LO power is sufficient to drive on a mixer diode of the FTD at its intended operating point. Testing the FTD with sufficient LO drive power is important because many of the parameters of the FTD, such as input return loss, output return loss, isolation between ports, and conversion efficiency, are very different when a mixer is on than when it is off (i.e. driven with a stimulus signal having insufficient power to drive the LO port at its intended operating point). In some embodiments, it is desirable to drive the LO port above and below its intended operating point to characterize the sensitivity of the parameters of the FTD to LO drive level.

The ability to perform vector-corrected measurements on and between ports of the FTD arises from the capability to perform one-port s-parameter calibrations at each of the three FTD calibration planes (i.e. input port 28, output port 36, and LO port 40); the capability to perform two-port s-parameter calibrations between any combination of two of the three FTD calibration planes; the capability to perform vector-corrected incident power calibrations at the calibration planes connected to the FTD input 28 and LO ports 28, 40; the capability to perform vector-corrected receiver calibrations at the calibration plane connected to the FTD output port 36; and the capability to drive the FTD input port with a signal at one frequency with a known power level while simultaneously driving the FTD LO port 40 with a second signal at a different frequency with a known power level and measuring the signal emanating from the FTD output port 36 at a third frequency, correcting for the effects of mismatch.

Figure 2:
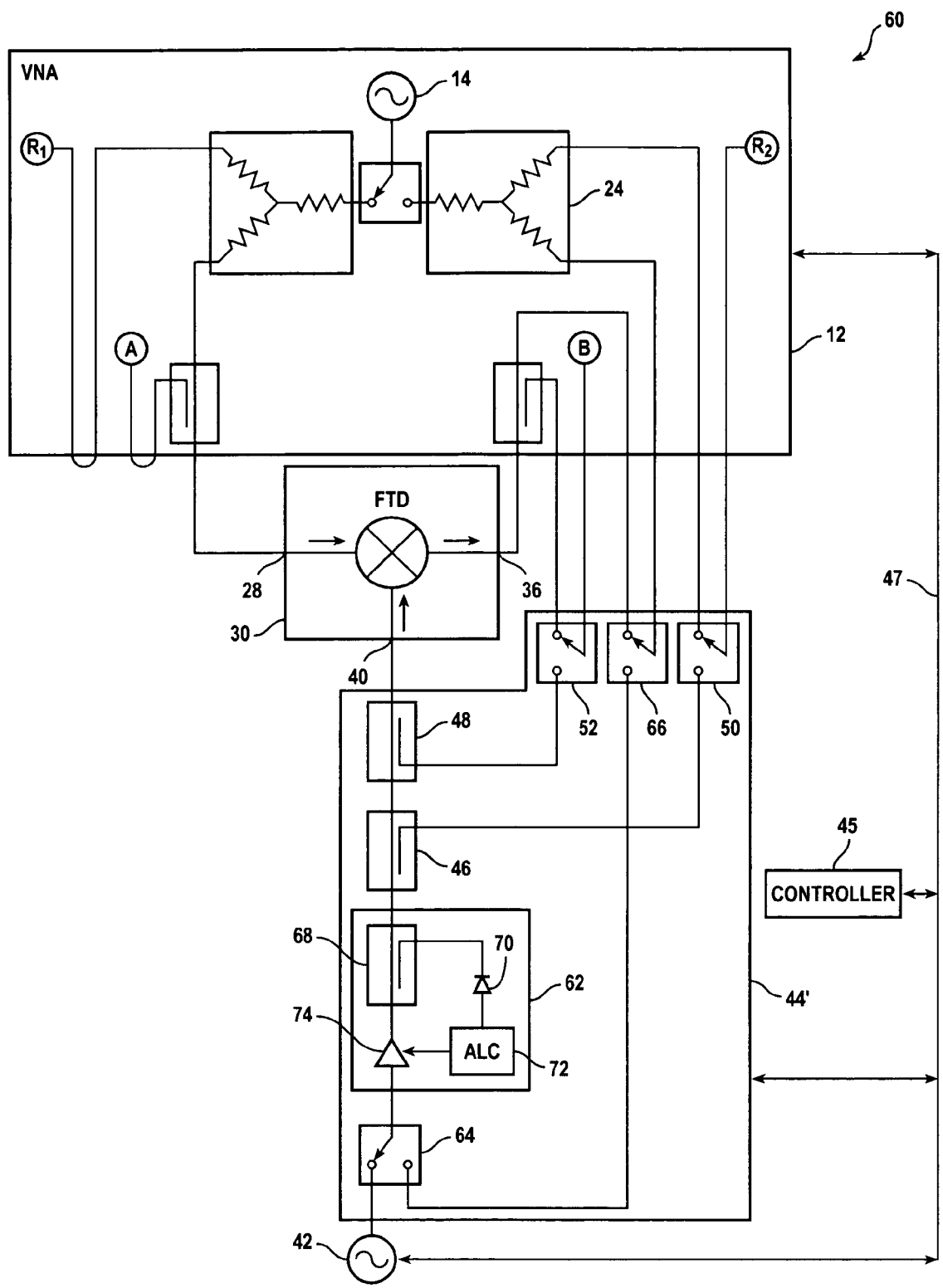
FIG. 2 is a diagram of another test system for performing vector network measurements according to an embodiment of the invention.

FIG. 2 is a diagram of another test system 60 for performing vector network measurements according to an embodiment of the invention. The VNA 12 and FTD 30 are as shown in FIG. 1. A test set 44' includes the LO reference directional coupler 46, LO test port direction coupler 48, test signal selection switch 52, and reference signal selection switch 50 as in the test system 10 shown in FIG. 1. The test set 44' also includes an automatic level control ("ALC") circuit 62, and LO source selector switches 64, 66. The LO source selector switches 64, 66 enable coupling the LO port 40 to either the internal stimulus source 14 or to the second source 42. The second source is integrated in a VNA or other test instrument in alternative embodiments.

The ALC circuit 62 includes a directional coupler 68, a detector 70, an ALC control circuit 72 and a leveling amplifier 74. Such ALC circuits are well-known in the art and therefore a detailed description of the ALC circuit 62 is omitted. The ALC circuit 62 provides a power-leveling loop closer to the LO port 40 of the FTD 30 than otherwise might be available from the second source 42, avoiding frequency slope due to cable and/or connector losses and other effects, such as thermal effects. The leveling amplifier 74 provides a more stable power level to the LO port 40 and in some embodiments provides greater power (i.e. "power boost" or "power gain") to the LO port than would otherwise be available from the second source 42.

The LO source selector switches 64, 66 allow the VNA 12 to measure vector parameters of the LO port 40 using the internal stimulus signal source 14 or the second source 42 to provide the LO signal. Using the internal stimulus signal source 14 and the associated power splitter 24 and reference receiver $R_2$ provides testing over a wider frequency range in some embodiments, such as when the operating frequency range of the internal stimulus signal source 14 is greater than the operating frequency range of the second signal source 42. Similarly, in some applications, the reference receiver $R_2$ provides superior tracking of the LO signal compared to the tracking of the second source 42 by the LO reference directional coupler 46.

Whether using an external second source in a frequency-translation application, an internal second source in a frequency-translation application, or an internal stimulus source in a conventional two-port application, it is desirable to characterize the test system at the LO test plane (e.g. LO port 40), particularly when the LO drive level is sufficiently high to simulate operating conditions of the FTD. For example, in the case of mixers, the LO port typically has high electromagnetic reflection at operating frequencies that can create significant standing waves on the LO transmission path of the test system. Placing an attenuator in series with the LO port to increase the apparent return loss is not an attractive approach because it reduces the power delivered to the LO port of the mixer. The couplers 46 and switches 53, 50 allow vector calibration of the LO power delivered to the LO test plane, and the optional LO source selector switches 64, 66 enable switching between LO sources. The optional ALC provides an improved source match in close proximity to the LO test plane, compared to an unleveled amplifier or a leveled or unleveled second source that has a number of cables and connector interfaces between the source and test plane.

II. Exemplary Methods

Figure 3A:
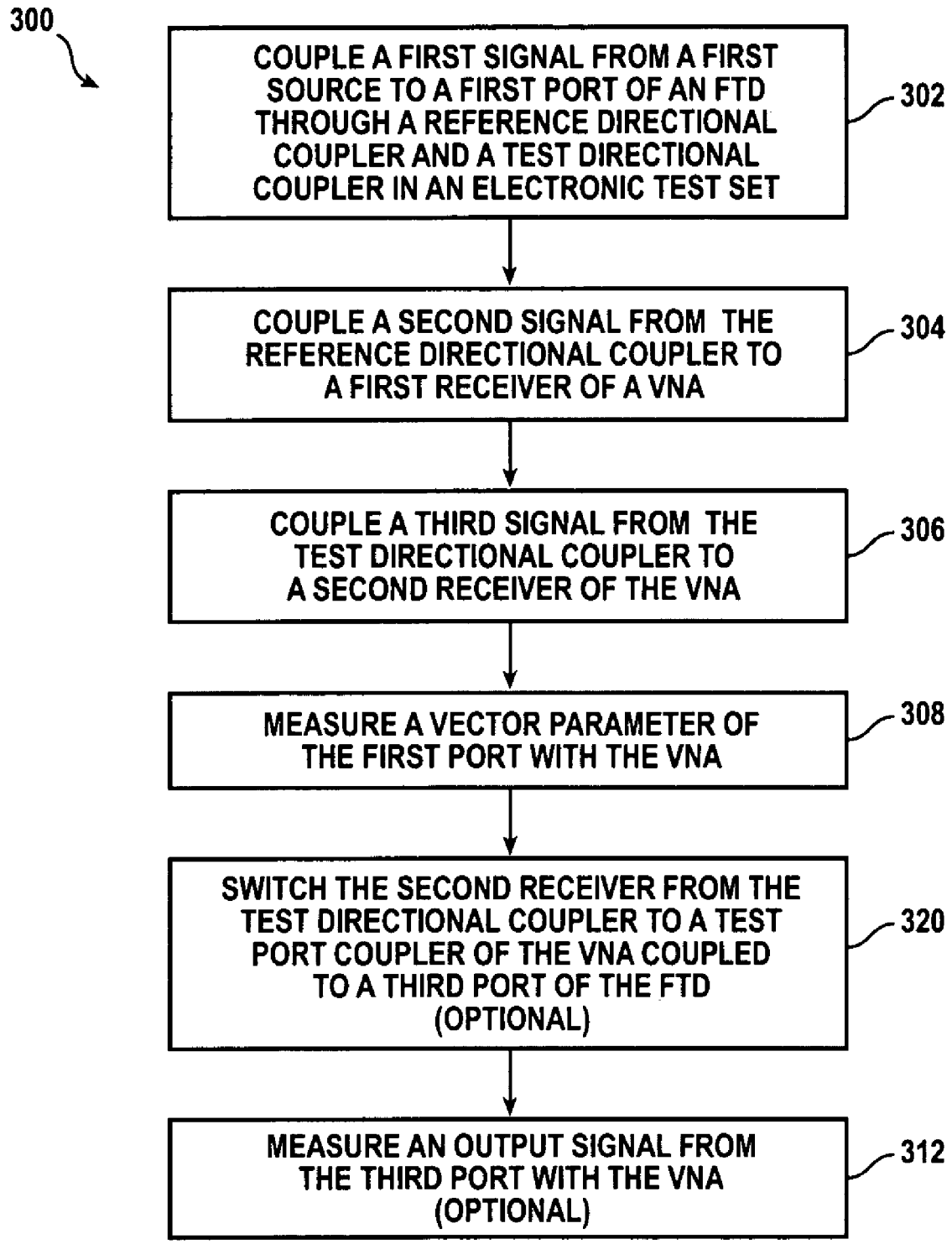
FIG. 3A is a flow chart of a method for measuring a frequency translation device according to an embodiment of the invention.

FIG. 3A is a flow chart of a method 300 for measuring an FTD according to an embodiment of the invention. A first signal from a first signal source is coupled to a first port of the FTD, such as the LO port, through a reference directional coupler and through a test directional coupler of an electronic test set (step 302). A second signal is coupled from the reference directional coupler to a first receiver of a VNA (step 304), and a third signal is coupled from the test directional coupler to a second receiver of the VNA (step 306). A vector parameter of the first port of the FTD is measured with the VNA (step 308). For example, the vector-corrected power incident on the LO port is measured, or the vector-corrected return loss or reflection coefficient of the LO port is measured. In a particular embodiment, an LO port of an FTD is driven with sufficient power to simulate operating conditions of the FTD (i.e. "LO operating power") and the return loss is measured. In a further embodiment, the LO power is changed and the measurement is repeated.

In a further embodiment, a fourth signal is coupled from a second port of the FTD, such as the input port, to another receiver of the VNA. In another embodiment, the second receiver is switched from the test directional coupler to a test port coupler of the VNA (step 310) that is coupled to a third port of the FTD, such as the output port, and an output parameter of the third port is measured (step 312). The switching is done by switches inside an electronic test set (see FIG. 1, ref. num. 52), for example.

Figure 3B:
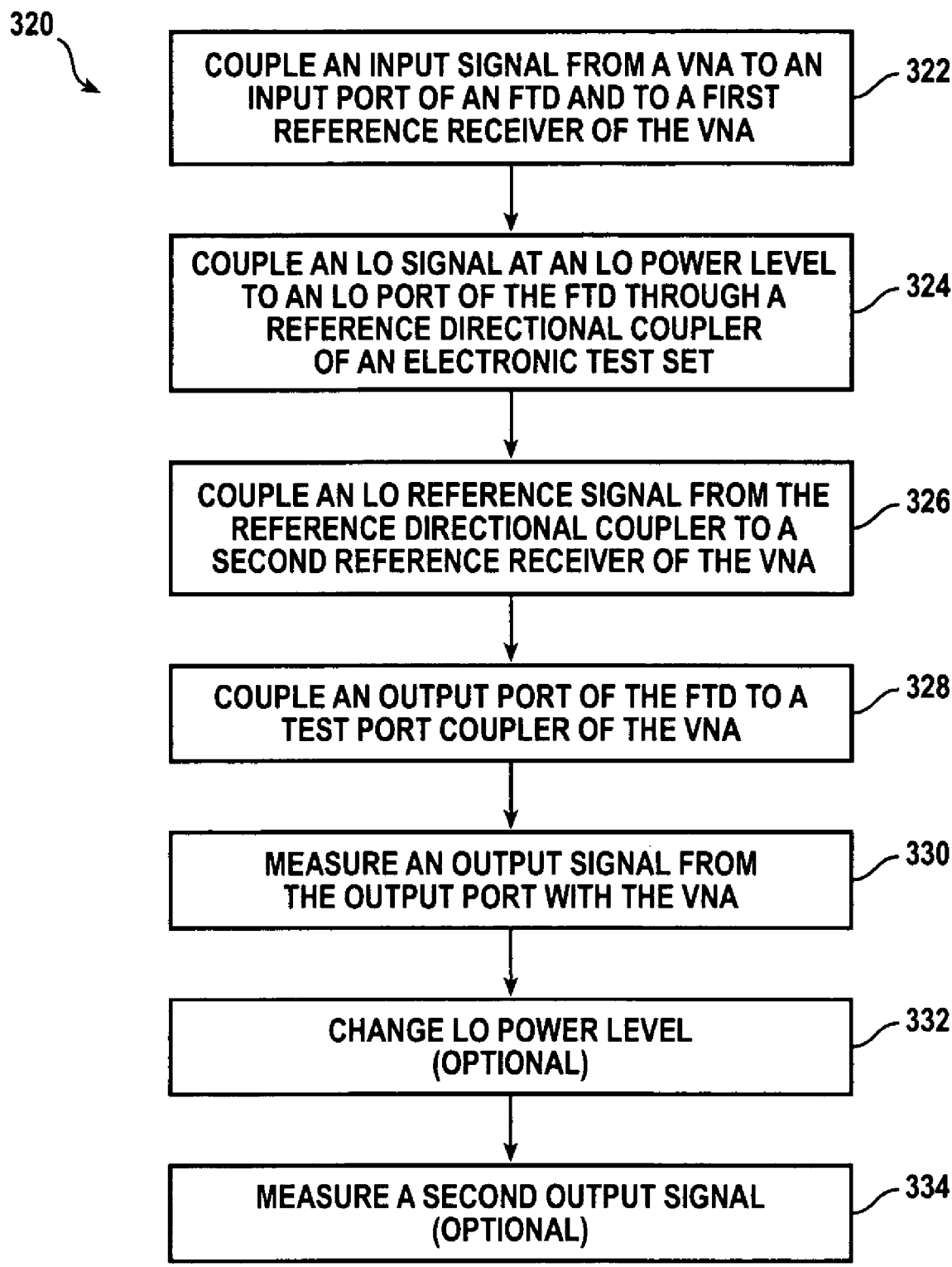
FIG. 3B is a flow chart of a method 320 for measuring an FTD according to another embodiment of the invention.

FIG. 3B is a flow chart of a method 320 for measuring an FTD according to another embodiment of the invention. An input signal at an input signal frequency is coupled to an input port of an FTD from an internal signal source of a VNA and to a first reference receiver of the VNA (step 322). An LO signal at an LO frequency and an LO power level is coupled to an LO port of the FTD through a reference directional coupler of an electronic test set from a second signal source (step 324). In a particular embodiment, the LO power level is sufficient to drive the FTD at its operating point. The second signal source is an external signal source or alternatively an internal second signal source of the two-port VNA. An LO reference signal is coupled from the reference directional coupler to a second reference receiver of the two-port VNA (step 326), and an output port of the FTD is coupled to a test port coupler of the VNA (step 328). An output signal from the output port is measured with the two-port VNA (step 330). In a further embodiment, the LO signal is changed to a second LO power level (step 332), and a second output signal is measured (step 334).

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method for vector characterization of a frequency translation device ("FTD") comprising:
   coupling a first signal from a signal source through a reference directional coupler and through a test directional coupler of an electronic test set to a first port of the FTD;
   coupling a second signal from a coupling port of the reference directional coupler to a first receiver of a vector network analyzer ("VNA");
   coupling a third signal from the test directional coupler to a second receiver of the VNA; and
   measuring a vector parameter of the first port of the FTD with the VNA.

2. The method of claim 1 wherein the electronic test set is external to the VNA.

3. The method of claim 1 wherein the first port is an LO port and the vector parameter comprises vector-corrected incident power on the LO port.

4. The method of claim 1 wherein the first port is an LO port and the vector parameter comprises a reflection coefficient of the LO port.

5. The method of claim 4 wherein the first signal has a first signal power level sufficient to drive the FTD at an LO operating power level.

6. The method of claim 5 further comprising:
   changing the first signal power level from the LO operating power level to a second LO power level; and
   measuring a second reflection coefficient of the LO port.

7. The method of claim 1 wherein the signal source is external to the VNA.

8. The method of claim 1 further comprising:
   coupling a fourth signal from a second port of the FTD to a third receiver of the VNA; and
   measuring an output parameter of the second port of the FTD.

9. The method of claim 1 further comprising:
   switching the second receiver to a test port coupler of the VNA, the test port coupler being coupled to a third port of the FTD; and
   measuring an output parameter of the third port of the FTD.

10. The method of claim 1 further comprising:
    coupling a fourth signal from an internal signal source of the VNA to a second port of the FTD and to a third receiver of the VNA;
    switching the second receiver to a test port coupler of the VNA, the test port coupler being coupled to a third port of the FTD; and
    measuring an output parameter of the third port of the FTD.

11. The method of claim 10 wherein the first signal is an LO drive signal at a first power level and further comprising:
    changing the LO drive signal from the first power level to a second power level; and
    measuring a second output parameter of the third port of the FTD.

12. The method of claim 10 wherein the first signal is at a first frequency, the fourth signal is at a second frequency and the output parameter is measured at a third frequency.

13. The method of claim 10 wherein the first signal is at a first frequency, the fourth signal is at a second frequency and the output parameter is measured at the second frequency.

14. The method of claim 10 wherein the first signal is stepped and the fourth signal is stepped.

15. The method of claim 10 wherein the first signal and the fourth signal are synchronously swept.

16. The method of claim 1 further comprising:
    coupling a fourth signal from an internal signal source of the VNA to a second port of the FTD;
    switching the second receiver to a test port coupler of the VNA wherein the test port coupler is coupled to a third port of the FTD; and
    measuring an output parameter of the fourth signal at the third port of the FTD.

17. The method of claim 1 further comprising:
    switching the first receiver from the second signal to a fourth signal from an internal signal source of the VNA; and
    measuring an output parameter of the fourth signal at the first port of the FTD.

18. The method of claim 1 further comprising a step of leveling the first signal between the signal source and the first port.

19. A method for vector characterization of a frequency translation device ("FTD") comprising:
   coupling an input signal at an input signal frequency from an internal signal source of a two-port vector network analyzer ("VNA") to an input port of the FTD and to a first reference receiver of the two-port VNA;
   coupling an LO signal at an LO signal frequency and at an LO power level from a second signal source through a reference directional coupler of an electronic test set to an LO port of the FTD;
   coupling an LO reference signal from a coupling port of the reference directional coupler to a second reference receiver of the two-port VNA;
   coupling an output port of the FTD to a test port coupler of the VNA; and
   measuring an output signal from the output port with the VNA.

20. The method of claim 19 further comprising:
   changing the LO signal to a second LO power level; and
   measuring a second output signal with the VNA.

* * * * *